United States Patent

Okada

Patent Number: 5,124,627
Date of Patent: Jun. 23, 1992

[54] BATTERY CAPACITY COMPUTING APPARATUS

[75] Inventor: Tetsuya Okada, Sumoto, Japan

[73] Assignee: Sanyo Electric Co., Ltd., Osaka, Japan

[21] Appl. No.: 650,424

[22] Filed: Feb. 4, 1991

[30] Foreign Application Priority Data

Feb. 7, 1990 [JP] Japan .................. 2-27484
Jun. 6, 1990 [JP] Japan .................. 2-148926

[51] Int. Cl.$^5$ .............................. H02J 7/04
[52] U.S. Cl. ........................... 320/44; 320/48; 340/636
[58] Field of Search ............ 320/43, 44, 48, 636

[56] References Cited

U.S. PATENT DOCUMENTS 3,735,234  5/1973  Godard ................... 320/44
4,307,330 12/1981  Belot ..................... 320/44
4,820,966  4/1989  Fridman ................ 320/44 X

FOREIGN PATENT DOCUMENTS 61-29079  2/1986  Japan .

Primary Examiner—R. J. Hickey
Attorney, Agent, or Firm—Darby & Darby

[57] ABSTRACT

A capacity computing apparatus for computing the capacity of a chargeable secondary battery by a microcomputer, wherein a resistance is connected to the secondary battery and a drop voltage because of charging and discharging current in the resistance is amplified by an amplifier, whereby the capacity of the secondary battery is computed on the basis of the amplified value. The capacity of the secondary battery is computed with good accuracy even with a small drop of the voltage in the resistance. Moreover, an influence of an offset voltage in the amplifier is removed by applying a constant voltage to the amplifier at all times. The stored value of the microcomputer is periodically updated, thereby avoiding an influence when the amplification degree of the amplifier is changed due to the temperature change.

13 Claims, 3 Drawing Sheets

BATTERY CAPACITY COMPUTING APPARATUS

BACKGROUND OF THE INVENTION

1. Field of the Invention

This invention relates to a capacity computing apparatus which computes the capacity of a chargeable secondary battery.

2. Description of Related Art

Japanese Patent Application Laid-Open No. 61-29079 (29079/1986) discloses an apparatus for measuring the capacity of a secondary battery. The disclosed apparatus is provided with a secondary battery, a current-detecting resistance connected in series to the secondary battery and a microcomputer connected to the secondary battery and current-detecting resistance to measure the amount of a charge and discharge of the secondary battery. The apparatus is so designed that a voltage generated in the current-detecting resistance is directly read by the microcomputer.

Meantime, since an 8-bit microcomputer becomes the fashion of the present time, approximately 1Ω resistance is required so as to directly read even a very small voltage generated in the current-detecting resistance. As the resistance is made larger, however, it becomes difficult to obtain a sufficient output voltage from the secondary battery because the drop voltage is increased due to the increased resistance. As such, it is desirable to restrict the voltage drop in the current-detecting resistance as much as possible to supply a sufficient output voltage to a load connected to the secondary battery. However, this requirement for restriction of the voltage drop invites need of improvement of the accuracy of the microcomputer, resulting in high cost in manufacturing the apparatus itself.

SUMMARY OF THE INVENTION

An object of this invention is to provide a capacity computing apparatus capable of computing the capacity of a secondary battery with good accuracy even when the drop of a voltage generated in a resistance for detecting a charging and discharging current is reduced.

Another object of this invention is to provide a capacity computing apparatus capable of computing the capacity of a secondary battery with high accuracy without improving the accuracy of a microcomputer.

A further object of this invention is to provide a capacity computing apparatus capable of preventing an erroneous computation due to an offset voltage of an amplifier such as an OP amplifier or the like when it is used.

A yet further object of this invention is to provide a capacity computing apparatus capable of avoiding an influence of the change in the amplification degree of an amplifier such as an OP amplifier or the like subsequent to the temperature change.

A capacity computing apparatus according to this invention is provided with current-detecting means (resistance) for detecting charging and discharging current of a secondary battery, amplifying means for amplifying voltage generated in the current-detecting means and computing means (microcomputer) for computing the capacity of the secondary battery on the basis of an output from the amplifying means. Since the capacity computing apparatus of this invention is so arranged that the voltage generated in the resistance is amplified, it becomes possible for the microcomputer to process the amplified and sufficiently large voltage even when the generated voltage is small. Therefore, even if the microcomputer exerts not high accuracy, the capacity of the secondary battery can be computed correctly.

Moreover, a capacity computing apparatus according to another feature of this invention is provided with current-detecting means (resistance) for detecting charging and discharging current of a secondary battery, reference voltage generating means for generating a reference voltage to be superposed to the voltage generated in the current-detecting means, amplifying means for superposing and amplifying the voltage generated in the current-detecting means and the reference voltage, and computing means (microcomputer) for computing the capacity of the secondary battery on the basis of an output from the amplifying means. In the capacity computing apparatus of this invention, voltage obtained by amplifying the reference voltage is set larger than the offset voltage of the amplifying means, and the microcomputer stores therein a computing result when the generated voltage in the resistance is zero. The capacity of the secondary battery is computed by subtracting the computing result stored in the microcomputer when the generated voltage in the resistance is zero from the computing result when the generated voltage in the resistance is not zero (charging and discharging states). Accordingly, the capacity of the secondary battery can be correctly computed without an influence of the offset voltage of the amplifying means. Moreover, the capacity computing apparatus is further provided with a first switch connected between an output terminal of the resistance and an input terminal of the amplifying means, and a second switch connected between the earth and the input terminal of the amplifying means. These switches are changed over through interlocking periodic opening/closure. Therefore, the stored value of the microcomputer can be periodically updated, thereby correcting the change in the amplification degree of the amplifying means subsequent to the change in the temperature.

Besides, the capacity computing apparatus of this invention may include a D/A converter which changes a digital signal as a reference generated from the computing means to an analog signal, comparing means (comparator) for comparing the analog signal generated by the D/A converter with an output of the amplifying means, and outputting the comparative result to the computing means, and display means for displaying the computing result obtained by the computing means, so that the capacity of the secondary battery is computed in compliance with the comparative result outputted from the comparing means, and the computing result is displayed by the display means.

The above and further objects and features of the invention will more fully be apparent from the following detailed description with accompanying drawings.

DESCRIPTION OF THE PREFERRED EMBODIMENTS

A capacity computing apparatus according to this invention will be discussed in detail taken in conjunction with preferred embodiments thereof with reference to the accompanying drawings.

FIRST EMBODIMENT

Figure 1:
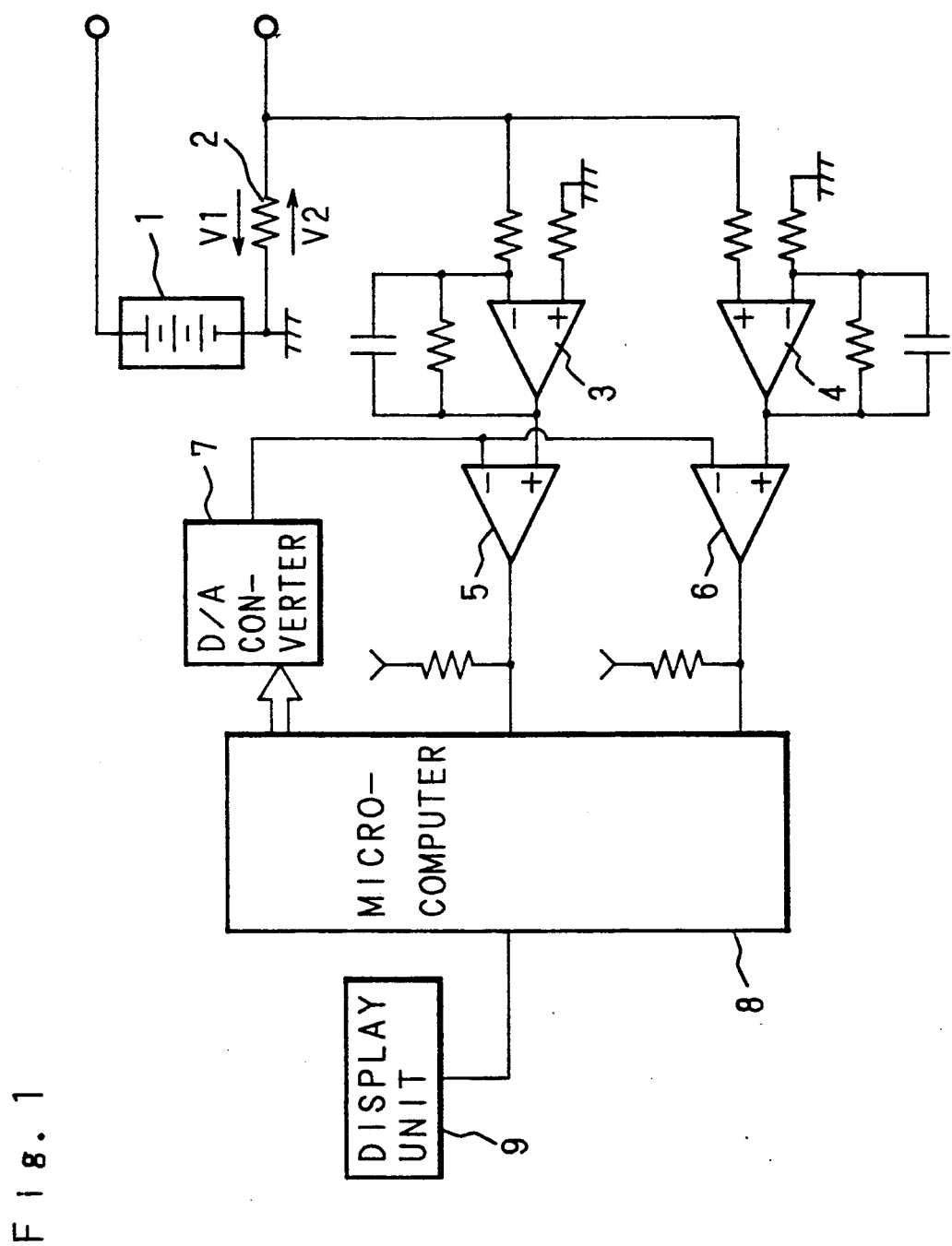
FIG. 1 is an electric circuit diagram of a capacity computing apparatus according to a first embodiment of this invention.

Referring to FIG. 1 showing an electric circuit diagram of a capacity computing apparatus according to the first embodiment, numeral 1 designates an Ni-Cd battery as a secondary battery which is an object to be computed and connected to the capacity computing apparatus of this invention. A resistance 2 as current-detecting means is connected in series to the battery 1. The resistance value of the resistance 2 is set to be several $m\Omega$-several tens $m\Omega$. In this structure, voltage corresponding to charging and discharging current of the battery 1 is generated at both ends of the resistance 2. A reverse amplifier 3 as a first amplifier and a non-reverse amplifier 4 as a second amplifier are connected to the resistance 2. The voltage generated in the resistance 2 is inputted to a ($-$) input terminal of the reverse amplifier 3 and to a ($+$) input terminal of the non-reverse amplifier 4. These amplifiers 3, 4 are driven by an alternative power source, without generating a negative output. More specifically, when the battery 1 is connected to a battery charger for charging, the reverse amplifier 3 generates a positive output. On the other hand, when the battery 1 is connected to a load or the like and discharged, the non-reverse amplifier 4 generates a positive output.

An output terminal of each amplifier 3, 4 is connected to ($+$) input terminals of a first and a second comparators 5, 6 which are comparing means. To a ($-$) input terminal of each comparator 5, 6 is inputted an analog signal generated from a D/A converter 7 which will be described later. An output terminal of each comparator 5, 6 is connected to a microcomputer 8 as computing means.

The microcomputer 8 generates a digital signal as a reference to the D/A converter 7 while the outputs of the comparators 5, 6 are inputted thereto. The digital signal is, after being converted to an analog signal by the D/A converter 7, inputted to ($-$) input terminals of the comparators 5, 6. The microcomputer 8 computes the residual capacity of the battery 1 on the basis of the outputs from the comparators 5, 6, with feeding the computing result to a display unit 9. The display unit 9 in turn displays the inputted computing result by turning ON an LED.

When the battery 1 is connected with the battery charger thereby allowing charging current to flow, a drop of voltage indicated by V1 in the drawing is brought about in the resistance 2. At this time, since the reverse and non-reverse amplifiers 3, 4 are inputted with a negative voltage, an output voltage of the reverse amplifier 3 is proportional to V1, while an output of the non-reverse amplifier 4 is GND level. In the meantime, when the battery 1 is connected with a load or the like, allowing discharging current to flow, a drop of voltage indicated by V2 in the drawing is caused in the resistance 2. At this time, an output of the reverse amplifier 3 is GND level, while an output voltage of the non-reverse amplifier 4 is proportional to V2. In the manner as described hereinabove, the voltage generated in the resistance 2 is amplified by the reverse amplifier 3 when the battery 1 is charged, or is amplified by the non-reverse amplifier 4 when the battery 1 is discharged.

The value of the digital signal generated by the microcomputer 8 changes with time, and is therefore converted to the analog signal in the form of stairs by the D/A converter 7. The comparators 5, 6 sequentially compare the analog signal with a voltage obtained by amplifying the voltage generated in the resistance 2, and output comparative result to the microcomputer 8. The microcomputer 8 computes on the basis of only the comparative result of the positive output of the amplifier and the analog signal. In other words, the microcomputer 8 computes on the basis of the output of the first comparator 5 when the battery 1 is charged. When the battery 1 is discharged, the microcomputer 8 computes on the basis of the output of the second comparator 6.

The operation of the capacity computing apparatus will be explained hereinbelow.

When the battery 1 is connected to a battery charger for charging, charging current flows in the resistance 2. The drop voltage V1 is generated at this time in the resistance 2, which is amplified by the reverse amplifier 3 and inputted to the ($+$) input terminal of the first comparator 5. The amplified voltage and the analog signal inputted to the first comparator 5 are compared sequentially with each other, and the comparative result is outputted to the microcomputer 8. The microcomputer 8 detects that the battery 1 is in the charging state, and at the same time computes a digital signal corresponding to the comparative result, whereby the residual capacity of the battery 1 is obtained and displayed by the display unit 9.

On the contrary, when the battery 1 is connected to a load, etc. and discharged, discharging current flows in the resistance 2. At this time, the drop voltage V2 is generated in the resistance 2 and amplified by the non-reverse amplifier 4 to be inputted to the ($+$) input terminal of the second comparator 6. The amplified voltage V2 and analog signal inputted to the second comparator 5 are sequentially compared with each other. The comparative result is output to the microcomputer 8, so that the microcomputer 8 detects that the battery 1 is in the discharging state, computing a digital signal corresponding to the comparative result and outputting the computing result to the display unit 9 as the residual capacity of the battery 1.

As is discussed hereinabove, according to the present embodiment, the voltage generated in the current-detecting resistance is amplified by the amplifier, and therefore even when the voltage generated in the resistance is small, the microcomputer can process the sufficiently large voltage. Accordingly, the microcomputer of 8-bit or so can compute the capacity of the battery with good accuracy, making the apparatus low at cost.

SECOND EMBODIMENT

If an OP amplifier is employed for the amplifier in the above first embodiment, an offset voltage is generated even with zero input. In such case, therefore, an output is generated from the amplifier even when charging and discharging current does not flow in the battery, causing an erroneous computation by the microcomputer. A second embodiment is devised to solve this problem.

Figure 2:
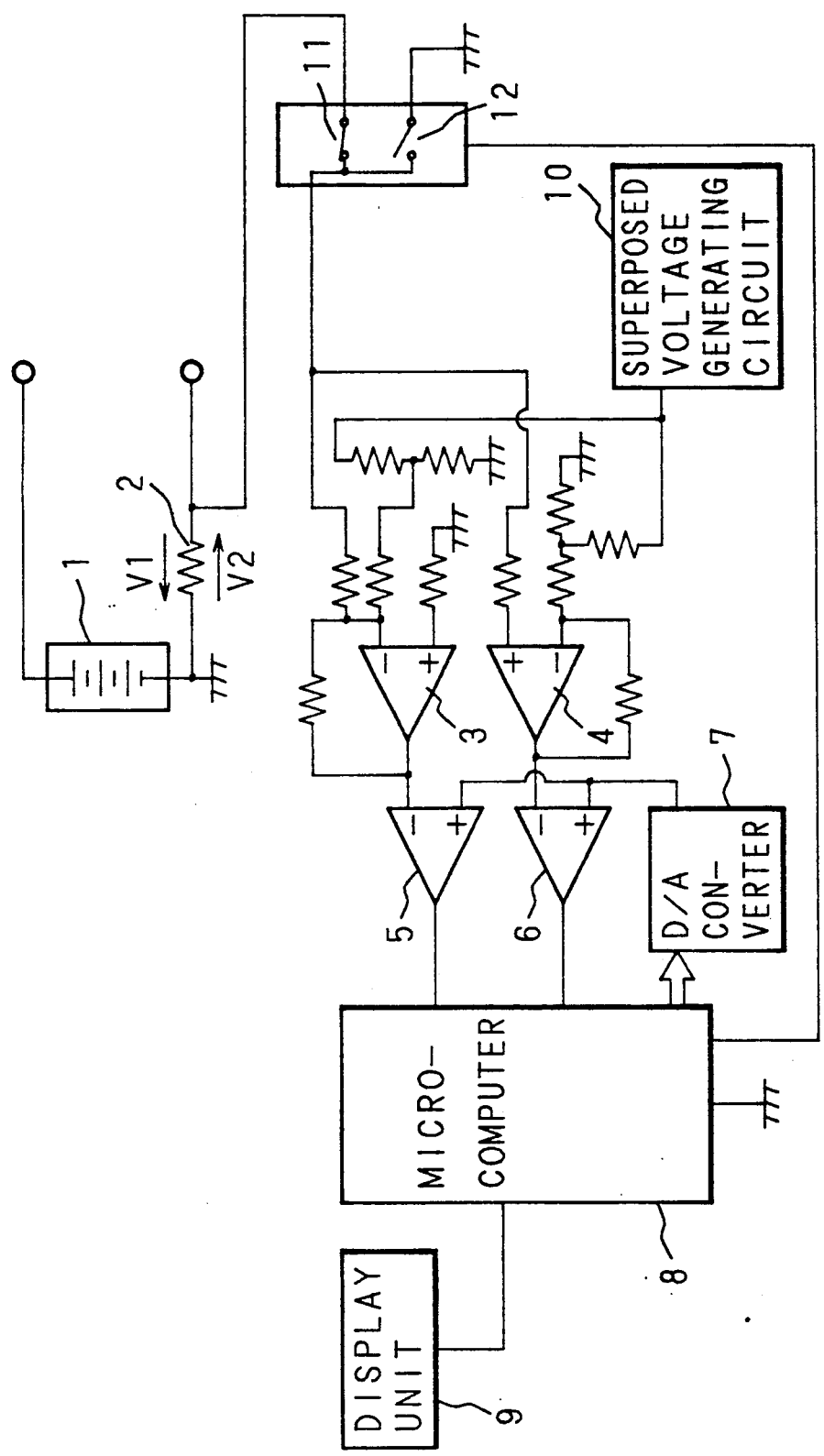
FIG. 2 is an electric circuit diagram of a capacity computing apparatus according to a second embodiment of this invention.

FIG. 2 illustrates the structure of a capacity computing apparatus according to the second embodiment of this invention. Parts of FIG. 2 designated by the same reference numerals as in FIG. 1 are the same parts, so that the description thereof will be abbreviated here.

Referring to FIG. 2, a superposed voltage generating circuit 10 always generates a negative voltage, for example, −3 V, which is, after being divided by the resistance, inputted to (−) input terminals of the reverse amplifier 3 and non-reverse amplifier 4. A first switch 11 is placed between an output terminal of the resistance 2 and the (+) input terminal of each amplifier 3, 4. Moreover, a second switch 12 is provided between an earthed contact and the (+) input terminal of each amplifier 3, 4. These switches 11, 12 are periodically changed over in the associative opening/closing operation by a control signal from the microcomputer 8. In general, the first switch 11 is closed, with the second switch 12 being opened. The first switch 11 is periodically opened for only a very short time while the second switch 12 is closed.

In the case where charging and discharging current flows in the battery 1, similar to the first embodiment, the reverse amplifier 3 generates a positive output when the battery 1 is charged, and the non-reverse amplifier 4 generates a positive output when the battery 1 is discharged. In the case where charging and discharging current does not flow in the battery 1, the resistance 2 does not generate voltage, thereby inputting no voltage to the amplifier 3, 4. However, since the superposed voltage generating circuit 10 always generates a negative voltage, the negative voltage is divided and inputted to (−) input terminals of the amplifiers 3, 4. The voltage obtained by amplifying the generated voltage of the superposed voltage generating circuit 10 is set larger than the offset voltage of the amplifiers 3, 4, so that the output voltage from each amplifier 3, 4 is always a positive value.

The first and second comparators 5, 6 compare the voltage obtained by amplifying the sum of the voltage from the resistance 2 and the negative voltage from the superposed voltage generating circuit 10 with the analog signal outputted from the D/A converter 7. The comparative result is sent to the microcomputer 8 from the comparators 5, 6. Therefore, the voltage value as an object of computation of the microcomputer 8 is a voltage obtained by amplifying the sum of the voltage generated in the resistance 2 and the negative voltage generated from the superposed voltage generating circuit 10.

The microcomputer 8 stores the computing result when only the voltage generated from the superposed voltage generating circuit 10 is inputted to the amplifiers 3, 4, that is, when charging and discharging current does not run in the battery 1. Thus, it becomes possible to integrate only the actually-measured values of the charging and discharging current of the battery 1 by integrating the subtracting result that the computing result to the voltage obtained by amplifying only the negative voltage generated from the superposed voltage generating circuit 10 is subtracted from the computing result to the voltage obtained by amplifying the sum of the voltage generated in the resistance 2 and the negative voltage generated from the superposed voltage generating circuit 10. The microcomputer 8 can be prevented from erroneously computing the capacity on basis of the output of the amplifiers although no charging and discharging current flows in the battery 1.

As mentioned earlier, generally the first switch 11 is closed, and the second switch 12 is opened. They are changed over by the microcomputer 8 for only a very short term periodically. As a result, while the battery 1 is being charged or discharged, the imitative state where the charging and discharging current does not flow in the battery 1 is produced for the very short term periodically. Concretely speaking, the second switch 12 is closed for 50 ms every 10 minutes when the battery 1 is not charged or discharged, while being closed for 25 ms every 3 minutes when the battery 1 is charged or discharged. This is to prevent the useless consumption of the battery 1 caused if the switches are changed over when the battery 1 is neither charged nor discharged.

When the second switch 12 is closed, the voltage generated from the added voltage generating circuit 10 alone is inputted to the amplifiers 3, 4, and the microcomputer 8 stores the computing result at this time. Accordingly, the stored value of the microcomputer 8 is periodically updated.

Now, the reason why the added voltage generating circuit 10 is provided in the apparatus and also why the stored value of the microcomputer 8 is periodically updated will be described below.

As described before, the microcomputer 8 is arranged to compute the capacity on the basis of the output from one amplifier generating a positive output. Therefore, the microcomputer 8 cannot perform an adding computation or a subtracting computation if the reverse amplifier 3 does not generate a positive output when the battery 1 is charged or the non-reverse amplifier 4 does not generate a positive output when the battery 1 is discharged, respectively. An amplifier generally outputs an offset voltage, approximately several mV even with an input of 0. Therefore, if this negative offset voltage is outputted directly from the amplifiers 3, 4, the microcomputer 8 becomes unable to compute. Accordingly, the superposed voltage generating circuit 10 is provided so that a negative voltage is not outputted from the amplifiers 3, 4 even when the charging and discharging current does not flow in the battery 1. Further, the offset voltage of the amplifier is known to be changed in accordance with the ambient temperature. Therefore, if a battery to be charged is in the vicinity of the amplifier, the offset voltage of the amplifier is changed due to the temperature change of the battery, thereby changing the amplification degree of the amplifier. The stored value of the microcomputer 8 is periodically updated in order to correct the change in the above-described amplification degree of the amplifier.

Figure 3:
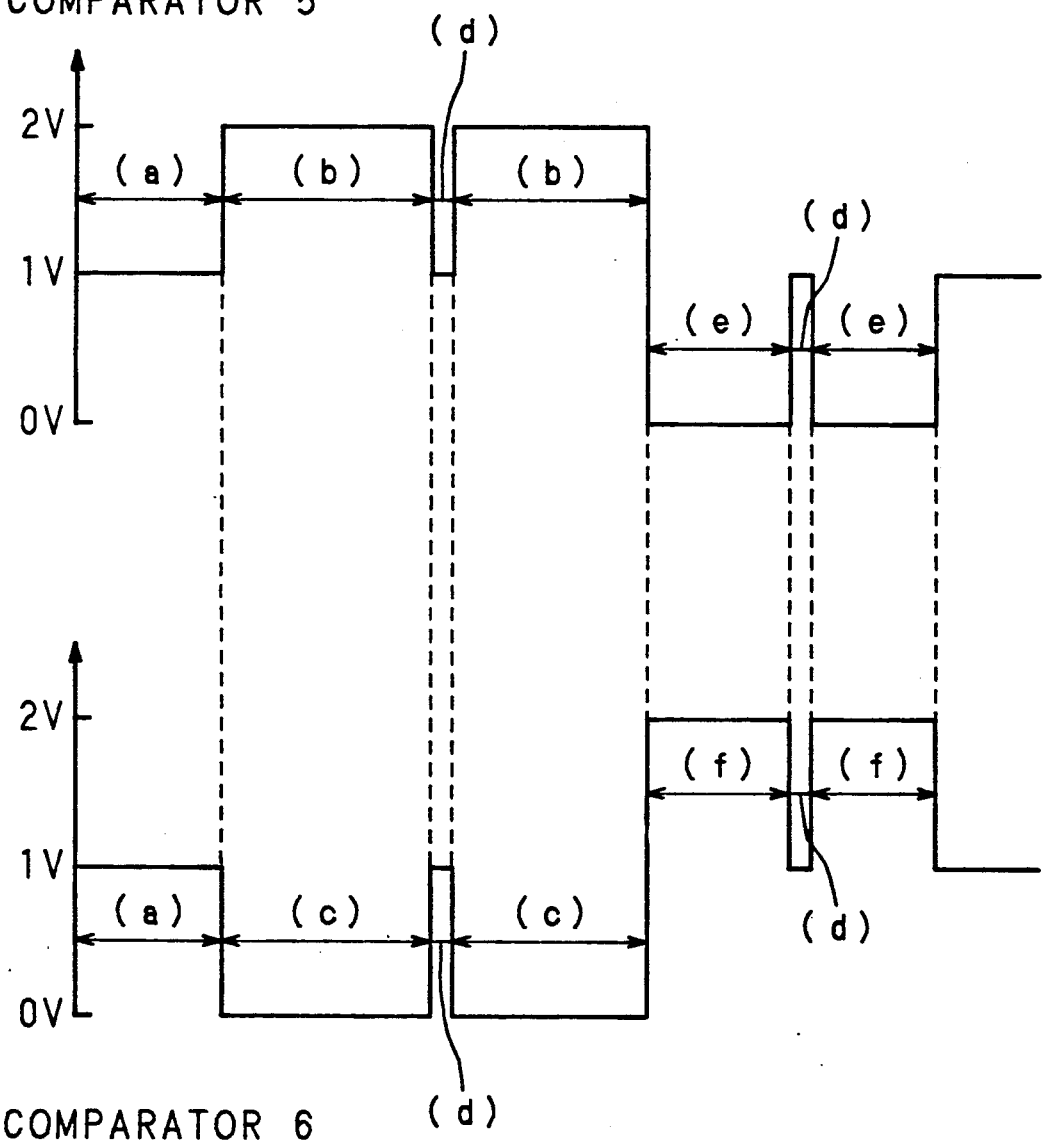
FIG. 3 shows waveforms outputted from comparators of the apparatus in the second embodiment.

The operation of the capacity computing apparatus of the second embodiment will be explained with reference to FIG. 3 which illustrates output waveforms of the comparators 5, 6.

Without charging and discharging current flowing in the battery 1, a reference voltage 1V is outputted from the comparators 5, 6 ((a)). When the battery 1 is connected to a battery charger, letting charging current 1A flow in the battery 1, an output of the comparator 5 is 2V, and an output of the comparator 6 is GND level ((b), (c)). The microcomputer 8 computes a digital signal corresponding to the value obtained by subtracting the reference voltage (1V in the instant embodiment) from the output of the comparator 5, with indicating the display unit 9 to display the computing result as the residual capacity of the battery 1. During the charging period, the second switch 12 is periodically closed, and therefore the above-noted imitative state where the charging current does not flow in the battery 1 is produced, when the reference voltage 1V is outputted from the comparators, 5, 6 with the stored value in the microcomputer 8 being updated ((d)).

On the other hand, when the battery 1 is connected to a load or the like and discharging current of 1A flows in the battery 1, an output of the comparator 5 becomes GND level, while an output of the comparator 6 is 2V ((e), (f)). The microcomputer 8 computes a digital signal corresponding to the value obtained by subtracting the reference voltage (1V) from the output of the comparator 6. The computing result of the microcomputer 8 is displayed by the display unit 9 as the residual capacity of the battery 1. The second switch 12 is periodically closed during the discharging period, so that imitative state without the discharging current flowing in the battery 1 is produced. The reference voltage 1V is outputted from the comparators 5, 6, and the stored value of the microcomputer 8 is updated ((d)).

In the case where an offset is present in the amplifiers 3, 4, the output waveforms of the comparators 5, 6 are moved parallel up and down, and the value computed by the microcomputer 8 as the charging and discharging current does not change. Accordingly, the capacity of the battery can be easily measured without influences of the offset even with very small charging and discharging current flowing in the battery 1.

Although it is so arranged that the superposed voltage generating circuit 10 generates a negative voltage in the above embodiment, this invention is not restricted to the above embodiment, but it may be possible that a positive voltage is generated from the superposed voltage generating circuit 10 and inputted to each (+) input terminal of the amplifiers 3, 4.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A capacity computing apparatus for computing the capacity of a secondary battery, comprising:
    a current-detecting resistor means connected in series with said secondary battery for detecting charging and discharging current of said secondary battery;
    amplifying means for amplifying the output signal of said current-detecting resistor means, said amplifying means having a first amplifier which amplifies the output signal of said current-detecting resistor means when said secondary battery is charged, and a second amplifier which amplifies the output signal of said current-detecting resistor means when said secondary battery is discharged;
    computing means for computing the capacity of said secondary battery on the basis of the output from said amplifying means;
    a D/A converter which converts a digital signal as a reference generated from said computing means to an analog signal; and
    comparing means for comparing the analog signal generated from said D/A converter with the output from said amplifying means, and outputting the comparative result to said computing means,
    wherein said computing means computes the capacity of said secondary battery in response to the comparative result.

2. A capacity computing apparatus as set forth in claim 1, further comprising:
    display means for displaying the computing result obtained by said computing means.

3. A capacity computing apparatus for computing the capacity of a secondary battery, comprising:
    current-detecting means for detecting charging and discharging current of said secondary battery;
    reference signal generating means for generating a reference signal to be superposed to the output signal of said current-detecting means;
    amplifying means for superposing and amplifying the output signal of said current-detecting means and said reference signal; and
    computing means for computing the capacity of said secondary battery on the basis of the output from said amplifying means.

4. A capacity computing apparatus as set forth in claim 3, wherein said computing means stores a reference computing result when the output signal of said current-detecting means is zero.

5. A capacity computing apparatus as set forth in claim 4, wherein said computing means computes the capacity of said secondary battery by substracting the reference computing result when the output signal of said current-detecting means is zero from the computing result when the output signal of said current-detecting means is not zero.

6. A capacity computing apparatus as set forth in claim 3, further comprising:
    a first switch connected between an output terminal of said current-detecting means and an input terminal of said amplifying means; and
    a second switch connected between the earth and the input terminal of said amplifying means.

7. A capacity computing apparatus as set forth in claim 6, wherein said first and second switches are periodically alternately changed over.

8. A capacity computing apparatus as set forth in claim 7, wherein the time while said first switch is closed is longer than the time while said second switch is closed.

9. A capacity computing apparatus as set forth in claim 8, wherein the period and time while said second switch is closed when said secondary battery is charged or discharged are shorter than those when said secondary battery is neither charged nor discharged.

10. A capacity computing apparatus as set forth in claim 3, wherein said current-detecting means is a resistance connected in series to said secondary battery.

11. A capacity computing apparatus as set forth in claim 3, wherein said amplifying means has a first amplifier which amplifies the output signal of said current-detecting means when said secondary battery is charged and, a second amplifier which amplifies the output signal of said current-detecting means when said secondary battery is discharged.

12. A capacity computing apparatus as set forth in claim 3, further comprising:
    a D/A converter which converts a digital signal as a reference generated from said computing means to an analog signal; and
    comparing means for comparing the analog signal generated from said D/A converter with the output from said amplifying means, and outputting the comparative result to said computing means,
    wherein said computing means computes the capacity of said secondary battery in response to the comparative result.

13. A capacity computing apparatus as set forth in claim 12, further comprising:
    display means for displaying the computing result obtained by said computing means.

* * * * *